United States Patent
Iwamura

(10) Patent No.: US 8,487,667 B2
(45) Date of Patent: Jul. 16, 2013

(54) HYBRID POWER DEVICE

(75) Inventor: Takahiro Iwamura, Nishio (JP)

(73) Assignee: DENSO CORPORATION, Kariya (JP)

( * ) Notice: Subject to any disclaimer, the term of this patent is extended or adjusted under 35 U.S.C. 154(b) by 197 days.

(21) Appl. No.: 13/020,218

(22) Filed: Feb. 3, 2011

(65) Prior Publication Data

US 2011/0199148 A1   Aug. 18, 2011

(30) Foreign Application Priority Data

Feb. 15, 2010  (JP) .................................. 2010-30221

(51) Int. Cl.
*H03K 3/00*   (2006.01)

(52) U.S. Cl.
USPC ............................. 327/109; 327/108; 327/112

(58) Field of Classification Search
USPC ......................... 327/108, 109, 112
See application file for complete search history.

(56) References Cited

U.S. PATENT DOCUMENTS

| 6,614,281 B1 * | 9/2003 | Baudelot et al. ............... 327/321 |
| 6,633,195 B2 * | 10/2003 | Baudelot et al. ............... 327/430 |
| 7,768,758 B2 * | 8/2010 | Maier et al. ................... 361/93.1 |
| 7,863,645 B2 * | 1/2011 | Masliah et al. ................ 257/168 |
| 7,969,243 B2 * | 6/2011 | Bracale et al. ................. 330/277 |
| 8,228,113 B2 * | 7/2012 | Domes .......................... 327/427 |
| 2001/0050589 A1 * | 12/2001 | Baudelot et al. .............. 327/430 |
| 2001/0054848 A1 * | 12/2001 | Baudelot et al. ................ 307/24 |
| 2002/0153938 A1 | 10/2002 | Baudelot et al. |

FOREIGN PATENT DOCUMENTS

JP   A-2006-324839   11/2006

OTHER PUBLICATIONS

Office Action mailed Feb. 14, 2012 in corresponding JP Application No. 2010-030221 (and English translation).

\* cited by examiner

*Primary Examiner* — Ryan Jager

(74) *Attorney, Agent, or Firm* — Posz Law Group, PLC

(57) ABSTRACT

A hybrid power device is formed of a normally-on type SiC-JFET and a normally-off type Si-MOSFET, which are connected in cascode with a source of the SiC-JFET and a drain of the Si-MOSFET being connected to each other thereby forming a hybrid power FET. A gate of the SiC-JFET and a source of the Si-MOSFET are connected via a switching speed regulating resistor. A capacitor is connected to the switching speed regulating resistor in parallel to control a switching speed to a first speed in a former part of the switching period of the hybrid power FET and to a second switching speed in a latter part of the switching period. The second switching speed is lower than the first switching speed.

6 Claims, 5 Drawing Sheets

US 8,487,667 B2

HYBRID POWER DEVICE

CROSS REFERENCE TO RELATED APPLICATION

This application is based on and incorporates herein by reference Japanese Patent Application No. 2010-30221 filed on Feb. 15, 2010.

FIELD OF THE INVENTION

The present invention relates to a hybrid power device, which is formed of a normally-on type SIC-JFET and a normally-off type Si-MOSFET connected in cascade.

BACKGROUND OF THE INVENTION

A SiC-JFET (junction type field effect transistor made of silicon carbide) is used more and more recently as a power device, which has a high withstand voltage and is suitable for use in power electronics devices such as inverters, DC-DC converters and switching power sources.

Since the SiC-JFET has no gate oxide film, it is manufactured more easily than a SiC-MOSFET. Since the SiC-JFET is generally normally-on type, however, the SiC-JFET is not suitable for use in power electronics devices or the like in a vehicle, which requires high reliability.

For this reason, it is proposed to connect a SiC-JFET in cascode with a normally-off type MOSFET, which is made of Si (silicon) and has a low withstand voltage, thereby to provide a hybrid power FET, which operates as a normally-off type switching element as a whole.

For example, as shown in FIG. 8, a hybrid power device is manufactured by cascode-connecting a normally-on type SiC-JFET and a normally-off type Si-MOSFET. The SiC-JFET and the Si-MOSFET are n-channel type. In this hybrid power device, a resistor 8 is connected to the gate of the Si-MOSFET 4 as an input resistor. A SE terminal is provided for sensing purpose at a junction (between the source of the SiC-JFET 2 and the drain of the Si-MOSFET 4), at which two FETs 2 and 4 are connected to form a hybrid power FET. The drain of the SiC-JFET 2, the source of the Si-MOSFET 4 and the gate of the Si-MOSFET 4 form a drain D, a source S and a gate G of the hybrid power FET, respectively. Parasitic components (capacitances C1 to C3, inductance L and the like shown in FIG. 8) are likely to be formed in manufacturing processes and cause resonance. A diode 6 connected between the drain and the source of the Si-MOSFET 4 is a parasitic diode formed in a Si-MOSFET structure. The Si-MOSFET 4 is subjected to high voltages transiently although its withstand voltage is low.

As a solution to this drawback, it is proposed by patent document 1, for example, to provide a resistor 10 between the gate of the SiC-JFET 2 and the source of the Si-MOSFET 4 for lowering switching operation speed of the hybrid power FET.

Patent document 1: US 2002/0153938A1

The resistor 10 thus provided between the gate of the SiC-JFET 2 and the source of the Si-MOSFET 4 is effective to lower the switching speed for preventing transient application of high voltage to the Si-MOSFET 4 and occurrence of resonance. However, the lowered switching speed will adversely increase switching loss, which is caused when the hybrid power FET turns on.

According to the hybrid power device shown in FIG. 8, discharge occurs in two stages as indicated by A and B in FIG. 9, when the hybrid power FET turns on. Specifically, in the first stage A, the Si-MOSFET 4 turns on when a gate voltage Vg2 is applied. Since a SE terminal voltage is lowered responsively, the gate-source capacitance C2 of the SiC-JFET 2 discharges as indicated by Q1. The gate-drain capacitance C1 of the SiC-JFET 2 discharges as indicated by Q2 in the second stage B.

The switching loss can be reduced in the first stage A by increasing the switching speed and shortening the period A between time t1 and time t2. The voltage developed by the resistor 10 (gate voltage Vg2 of the SIC-JFET 2) changes in the negative direction at this time. It is however preferable that the gate voltage Vg2 is as high as possible, that is, the change in the negative direction is as small as possible, to maintain high switching speed.

In the second stage B, it is preferred to lower the switching speed for stabilization of operation because resonance is likely to occur. Although the voltage of the resistor (gate voltage Vg2 of the SiC-JFET 2) changes in the negative direction at this time as well, it is preferable that the gate voltage Vg2 is as low as possible. This is because the switching speed is lowered and hence the resonance can be suppressed more.

The resistor 10 in the proposed technology, however, is only effective to lower the switching speed. That is, even if the resistor 10 suppresses resonance in the second stage B, it adversely increases the switching loss in the first stage A.

SUMMARY OF THE INVENTION

It is therefore an object of the present invention to suppress resonance and reduce switching loss of a hybrid power FET, which is formed of a cascode-connected normally-on type SiC-JFET and a normally-off type Si-MOSFET.

According to one aspect of the present invention, a hybrid power device includes a hybrid power FET and a control circuit part. The hybrid power FET is formed of a normally-on type SiC-FET and a normally-off type Si-MOSFET, which are cascode-connected with a source of the SiC-JFET and a drain of the Si-MOSFET being connected to each other. The control circuit part is connected to a gate of the SiC-JFET for varying a gate current and a gate voltage of the SiC-JFET in a switching period of the hybrid power FET thereby to control a switching speed of the hybrid power FET to a first switching speed in a former part of the switching period and to a second switching speed in a latter part of the switching period, respectively. The second switching speed is lower than the first switching speed.

Preferably, the control circuit part includes a speed regulating resistor provided between the gate of the SIC-JFET and a source of the Si-MOSFET for regulating the switching speed and a capacitor connected to the gate of the SIC-JFET.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in more detail with reference to a variety of embodiments.

First Embodiment

Figure 1:
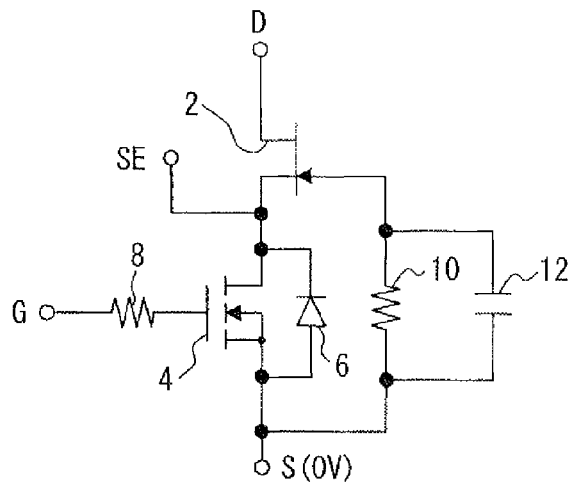
FIG. 1 is a circuit diagram showing a hybrid power device according to a first embodiment of the present invention.

Referring first to FIG. 1, a first hybrid power device according to a first embodiment is formed of a normally-on type SiC-JFET 2 and a normally-off type Si-MOSFET 4. The source of the SiC-JFET 2 and the drain of the Si-MOSFET 4 are connected to each other so that the SiC-JFET 2 and the Si-MOSFET 4 are connected in cascade. This basic configuration is similar to that shown in FIG. 8 and form a hybrid power FET.

Figure 8:
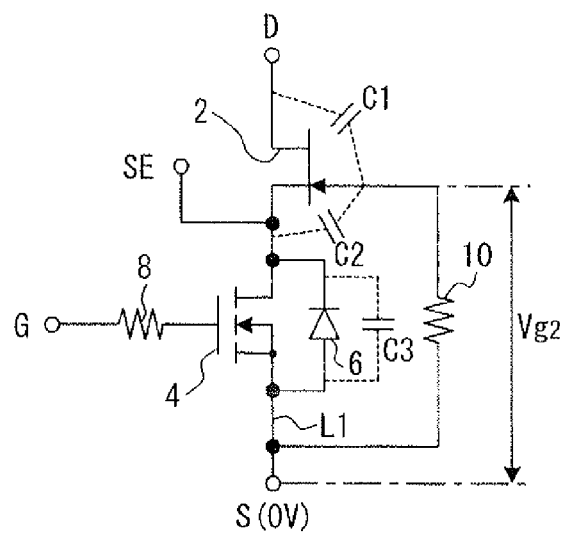
FIG. 8 is a circuit diagram showing a hybrid power device according to a prior art.
Figure 9:
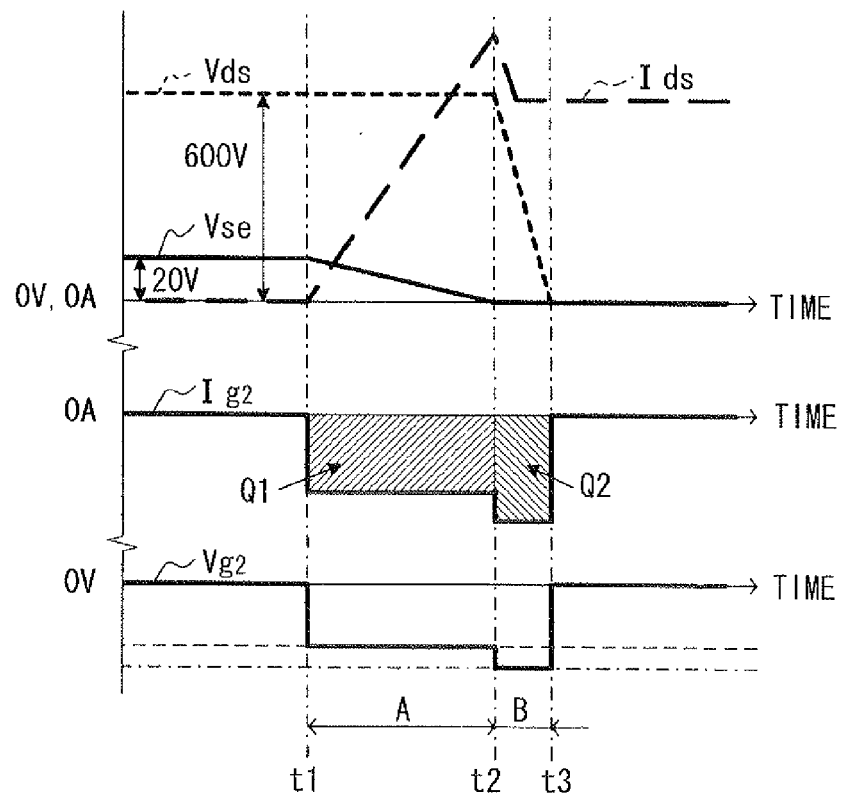
FIG. 9 is a timing diagram showing an operation of the hybrid power device according to the prior art.

The first hybrid power device is however different from that shown in FIG. 8 in that, in a control circuit part for the hybrid power FET, a capacitor 12 is connected in parallel to a speed regulating resistor 10, which is provided between the gate of the SiC-JFET 2 and the source of the Si-MOSFET 4 as a control element for controlling a switching speed of the hybrid power device. Since the capacitor 12 is connected in parallel to the speed regulating resistor 10, the switching speed is controllable by the capacitor 12 in a switching period.

Figure 2:
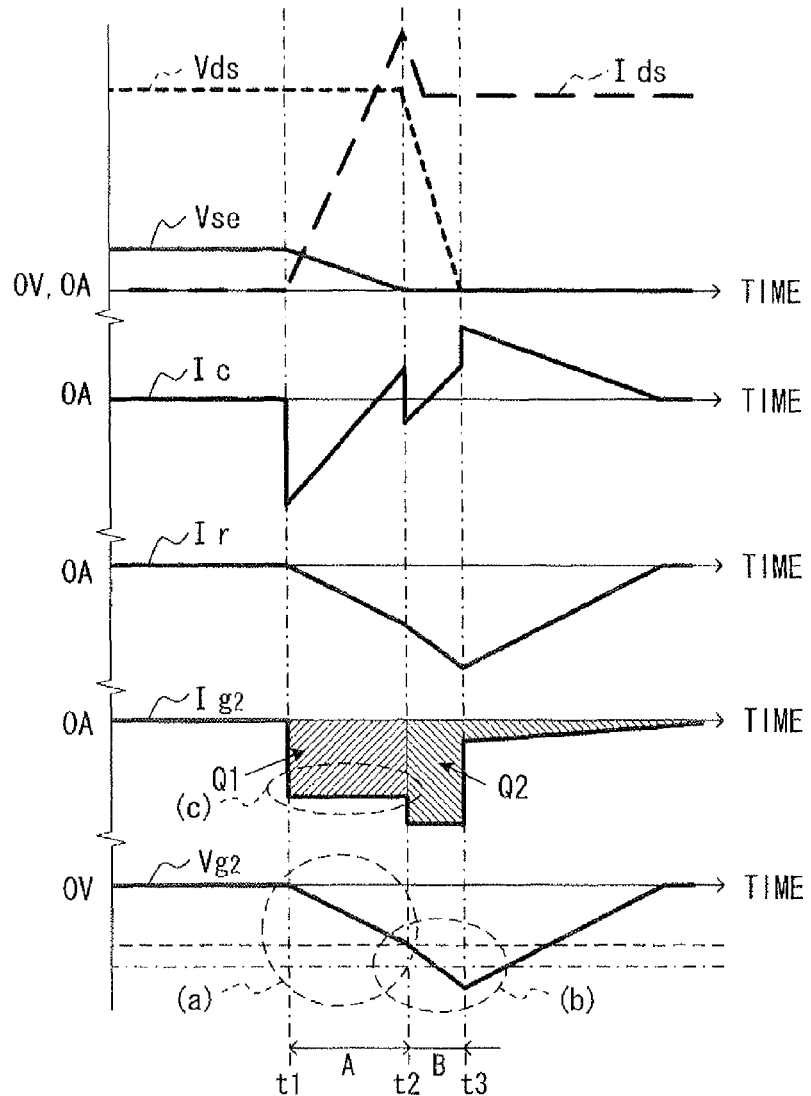
FIG. 2 is a timing diagram showing an operation of the hybrid power device according to the first embodiment.

This control is described further with reference to FIG. 2, which shows a drain-source voltage (Vds), a drain current (Ids), a SE terminal voltage Vse, a capacitor current Ic flowing in the capacitor 12, a speed regulating resistor current Ir flowing in the speed regulating resistor 10, and a gate current Ig2 and a gate voltage Vg2 of the SiC-JFET 2, when the hybrid power device turns on.

The capacitor current Ic and the speed regulating resistor current Ir are indicated as being positive (higher than 0 volt and 0 ampere) and negative (lower than 0 volt and 0 ampere), when the currents Ic and Ir flow from the resistor 10 or the capacitor 12 to the source S and when the currents Ic and Ir flow from the source S to the resistor 10 or the capacitor 12, respectively. The device discharges in two stages A and B in the conventional manner as shown in FIG. 2. In the first stage A, a gate-source capacitance (exemplified as C2 in FIG. 8) of the SiC-JFET 2 discharges as the SE terminal voltage Vse falls in response to turn-on of the Si-MOSFET 4. In the second stage B, a gate-drain capacitance (exemplified as C1 in FIG. 8) of the SiC-JFET 2 discharges.

In the discharge in the first stage A, currents flow to both the resistor 10 and the capacitor 12 from the source S of the Si-MOSFET 4. Since the capacitor 12 has little charge at the initial condition, more current flows to the capacitor 12 than to the resistor 10. When the capacitor 12 stores more charge as more current flows to the capacitor 12, that is, when the capacitor voltage of the capacitor 12 increases, the capacitor current Ic flowing to the capacitor 12 decreases and the resistor current Ir flowing to the resistor 10 increases.

The gate current Ig2 of the SiC-JFET 2 is expressed as a sum of the capacitor current Ic and the resistor current Ir, that is, Ig2=Ic+Ir. The charge of the gate current of the SiC-JFET 2 corresponds to an electric charge Q1 discharged by the gate-source capacitance of the SiC-JFET 2. Thus, the capacitor 12 effectively operates in the first stage A as shown by (a) in FIG. 2. Since the gate voltage Vg2 of the SiC-JFET 2 is less likely to fall, the switching operation is speeded up. In the first stage A, as the switching is speeded up, the gate current Ig2 of the SiC-JFET 2 increases as shown by (c) in FIG. 2.

In the second stage B, the capacitor 12 already stores charge, that is, the gate voltage Vg2 of the SiC-JFET 2 is not zero, the current is less likely to flow to the capacitor 12. Accordingly, more current flows to the resistor 10 and the gate voltage Vg2 of the SiC-JFET 2 is likely to fall. In the second stage B, therefore, the capacitor 12 loses its switching speed-up function and the gate voltage Vg of the SiC-JFET 2 falls. As a result, as shown by (b) in FIG. 2, the switching operation is slowed down.

Figure 10A:
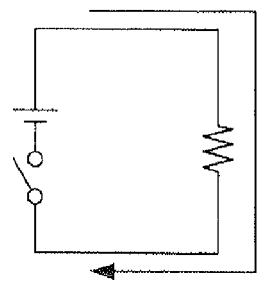
FIGS. 10A to 10F are schematic circuit diagrams and timing diagrams showing comparison between hybrid power devices according to the invention and the prior art.
Figure 10B:
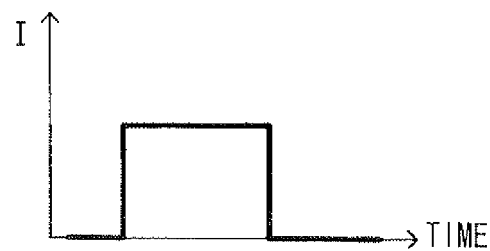
Figure 10C:
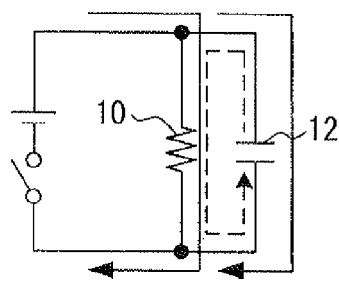
Figure 10D:
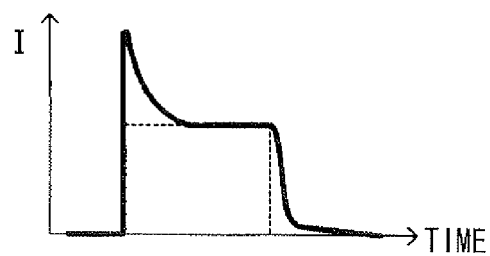

In case of the prior art device (FIG. 8), which corresponds to an equivalent circuit shown in FIG. 10A, a current I is fixed as shown in FIG. 10B when the hybrid power device turns on. According to the first embodiment, which corresponds to an equivalent circuit shown in FIG. 10C, a large current flows to the capacitor 12 at first and the capacitor 12 is charged when the hybrid power FET turns on. As the capacitor 12 is charged, the current is reduced and flows to the speed regulating resistor 10. Finally, the charge stored in the capacitor is discharged through the resistor 10. Thus, the current I changes as shown in FIG. 10D. Thus, the first embodiment is advantageous in that a large current is supplied to the gate of the SiC-JFET 2 first in the former part of the switching operation to thereby raise the switching speed of the hybrid power FET to a first switching speed, the current is reduced in the latter part of the switching operation thereby to lower the switching speed to a second switching speed lower than the first switching speed and the current is continued to flow even after the switching operation. Thus, the switching speed of the hybrid power device is appropriately controlled by the combination of the resistor 10 and the capacitor 12.

Second Embodiment

Figure 3:
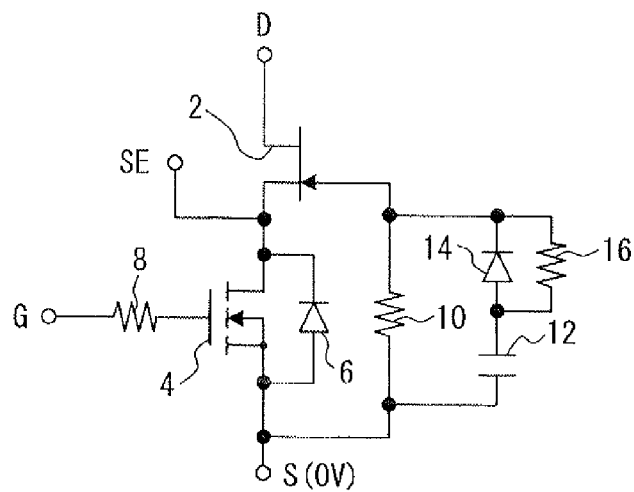
FIG. 3 is a circuit diagram showing a hybrid power device according to a third embodiment of the present invention.

In a second hybrid power device according to a second embodiment, as shown in FIG. 3, a parallel circuit of a diode 14 and a parallel resistor 16 are connected in series with the capacitor 12. The diode 14 and the parallel resistor 16 are connected in parallel to each other. The second hybrid power device has the same structure as that of the first embodiment in other respects. The diode 14 is reverse-biased with its anode and cathode connected to the capacitor 12 and the gate of the SiC-JFET 2, respectively. The resistance of the parallel resistor 16 is set to be smaller than that of the resistor 10.

Figure 4:
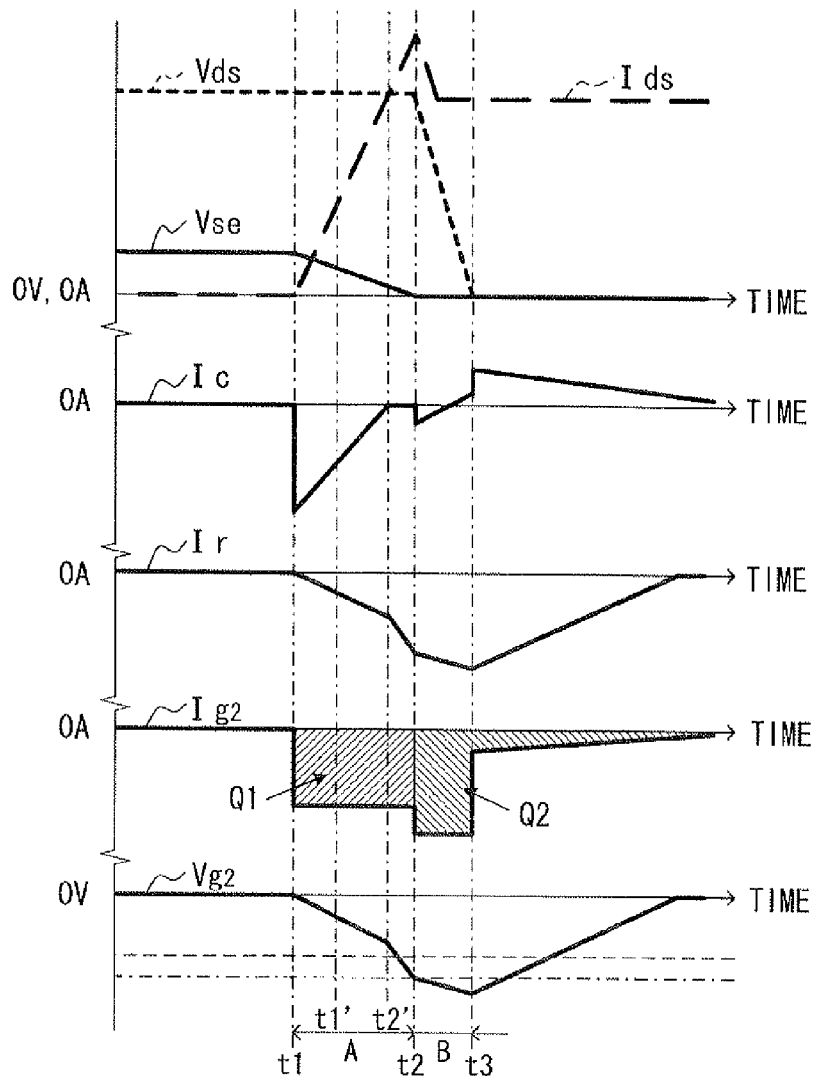
FIG. 4 is a timing diagram showing an operation of the hybrid power device according to the second embodiment.

In the second hybrid power device, as shown in FIG. 4, the current primarily flows through the diode 14 in a former period (time t1 to time t1') in the first stage A when the Si-MOSFET 4 turns on. The capacitor 12 is charged in a subsequent period (time t1' to time t2') in the first stage A, and starts discharge after time t2'.

Since the diode 14 is reverse-biased at the time of discharge of the capacitor 12, flow of the discharge current is limited by the resistance of the parallel resistor 16, which is preferably set to be comparatively large. Thus the capacitor 12 maintains its charge, that is, capacitor voltage.

Since the capacitor 12 maintains its charge in the second stage B, the current is less likely to flow. The amount of the gate current Ig2 of the SiC-JFET 2, which flows through the resistor 10, increases. The gate voltage Vg2 of the SiC-JFET 2 thus falls more in comparison to the first embodiment. As a result, switching speed is lowered more effectively from the first switching speed.

Third Embodiment

Figure 5:
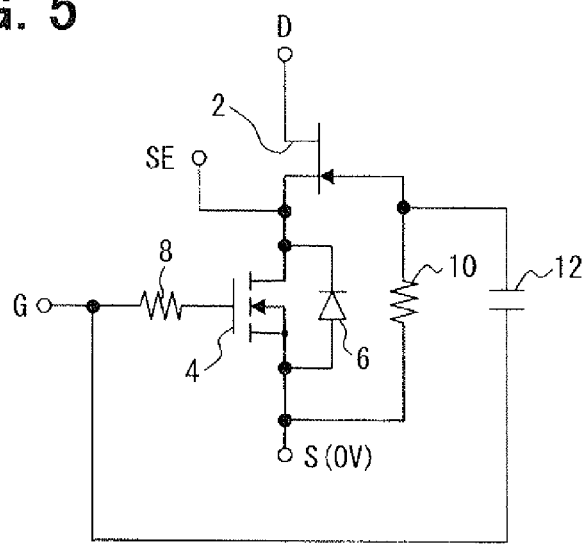
FIG. 5 is a circuit diagram showing a hybrid power device according to a third embodiment of the present invention.

In a third hybrid power device according to a third embodiment, as shown in FIG. 5, the capacitor 12 of the control circuit part is connected between the gate of the SiC-JFET 2 and the gate of the of the Si-MOSFET 4 differently from the first embodiment, in which it is connected in parallel to the resistor 10. The third hybrid power device has the same structure as that of the first embodiment in other respects.

The capacitor 12 is connected to a drive circuit for the Si-MOSFET 4 directly in the end. Delay in operation of the SiC-JFET 2 relative to the on/off operation of the Si-MOSFET 4 is thus reduced. Accordingly, the switching speed is increased and transient voltage change of the Si-MOSFET 4 is suppressed.

That is, the switching speed is increased by relatively speeding up the operation of the SiC-JFET 2 in the third embodiment, as opposed to the first embodiment, in which the SiC-JFET 2 starts to operate with delay after the on/off switching operation of the Si-MOSFET 4.

Fourth Embodiment

Figure 6:
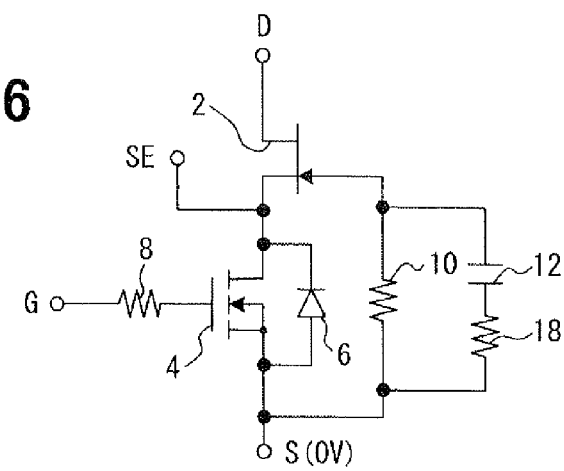
FIG. 6 is a circuit diagram showing a hybrid power device according to a fourth embodiment of the present invention.

In a fourth hybrid power device according to a fourth embodiment, as shown in FIG. 6, a series resistor 18 is connected in series with the capacitor 12 in the control circuit part relative to the first embodiment. The fourth hybrid power device has the same structure as that of the first embodiment in other respects.

Figure 10E:
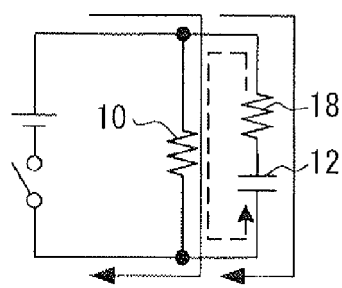
Figure 10F:
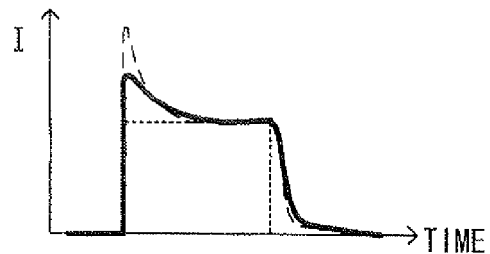

The fourth hybrid power device is shown as equivalent circuit in FIG. 10E. In this case, with the series resistor 18 connected in series with the capacitor 12, it is possible to adjust the current, particularly peak current, flowing to the capacitor 12 and period of current flow by a time constant of the capacitor 12 and the series resistor 18, such as a resistance of the series resistor 18, as shown by a solid line in FIG. 10F.

It is also possible to vary the charge current and the discharge current by connecting a diode in series with the series resistor 18 if resonance should be reduced more.

Fifth Embodiment

Figure 7:
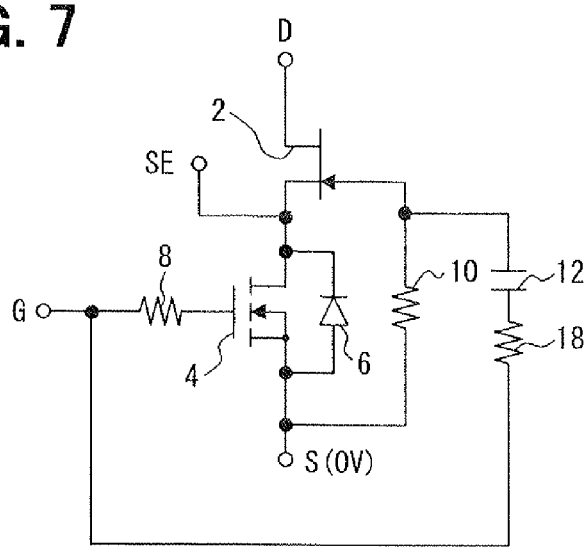
FIG. 7 is a circuit diagram showing a hybrid power device according to a fifth embodiment of the present invention.

In a fifth hybrid power device according to a fifth embodiment, as shown in FIG. 7, a series resistor 18 is connected in series with the capacitor 12 in the control circuit part of the third embodiment. The fifth hybrid power device has the same structure as that of the third embodiment in other respects.

With the series resistor 18 connected in series with the capacitor 12, it is possible to adjust the current, particularly peak current, flowing to the capacitor 12 and period of current flow by resistance of the series resistor 18 in the similar manner as in the fourth embodiment.

The present invention is not limited to the disclosed embodiments but may be implemented in many other ways.

What is claimed is:

1. A hybrid power device comprising:
a hybrid power FET formed of a normally-on type SiC-JFET and a normally-off type Si-MOSFET, which are cascode-connected with a source of the SiC-JFET and a drain of the Si-MOSFET being connected to each other; and
a control circuit part connected to a gate of the SiC-JFET for varying a gate current and a gate voltage of the SiC-JFET in a switching period of the hybrid power FET thereby to control a switching speed of the hybrid power FET to first switching speed in a former part of the switching period and to a second switching speed lower than the first switching speed in a latter part of the switching period, respectively,
wherein the control circuit part includes:
a speed regulating resistor provided between the gate of the SiC-JFET and a source of the Si-MOSFET for regulating the switching speed; and
a capacitor connected to the gate of the SiC-JFET, and
wherein the capacitor is connected in parallel to the speed regulating resistor.

2. The hybrid power device according to claim 1, wherein the control circuit part further includes:
a parallel circuit formed of a diode and a parallel resistor and connected in series with the capacitor; and
a series circuit of the capacitor and the parallel circuit is connected in parallel to the speed regulating resistor.

3. The hybrid power device according to claim 1, wherein:
the control circuit part further includes a series resistor connected to the capacitor in series and having a resistance smaller than that of the speed regulating resistor.

4. A hybrid power device comprising:
a hybrid power FET formed of a normally-on type SiC-JFET and a normally-off type Si-MOSFET, which are cascode-connected to each other; and
a control circuit part connected to a gate of the SiC-JFET for regulating a switching speed of the hybrid power FET from a high switching speed to a low switching speed in a switching period of the hybrid power FET,
wherein the control circuit part includes a resistor and a capacitor, which are connected in parallel relation to each other between a gate of the SiC-JFET and a source of the Si-MOSFET.

5. The hybrid power device according to claim 4, wherein:
the control circuit part further includes a series resistor connected in series with the capacitor between the gate of the SiC-JFET and the source of the Si-MOSFET.

6. The hybrid power device according to claim 5, wherein:
the control circuit part further includes a diode connected in parallel to the series resistor.

* * * * *